(12) United States Patent
Leonardi (10) Patent No.: US 6,891,208 B2
(45) Date of Patent: May 10, 2005

(54) PROTECTION STRUCTURE AGAINST ELECTROSTATIC DISCHARGES (ESD) FOR AN ELECTRONIC DEVICE INTEGRATED ON A SOI SUBSTRATE, AND CORRESPONDING INTEGRATION PROCESS

(75) Inventor: Salvatore Leonardi, Aci S. Antonio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/268,054

(22) Filed: Oct. 8, 2002

(65) Prior Publication Data

US 2003/0137009 A1 Jul. 24, 2003

(30) Foreign Application Priority Data

Oct. 9, 2001 (EP) .............................................. 01830639

(51) Int. Cl.[7] .............................................. H01L 29/74
(52) U.S. Cl. ........................ 257/173; 257/174; 257/355; 257/356; 257/509; 257/510
(58) Field of Search ................................. 257/173, 174, 257/355, 356, 357, 358, 360, 362, 365, 367, 363, 509, 510

(56) References Cited

U.S. PATENT DOCUMENTS

| | | | |
|---|---|---|---|
| 5,650,354 A | | 7/1997 | Himi et al. ..................... 437/63 |
| 6,074,899 A | | 6/2000 | Voldman ..................... 438/155 |
| 6,232,163 B1 | * | 5/2001 | Voldman et al. ............. 438/212 |
| 6,573,566 B2 | * | 6/2001 | Ker et al. ..................... 257/355 |
| 2001/0015429 A1 | | 8/2001 | Leonardi et al. ................. 257/1 |
| 2001/0022384 A1 | | 9/2001 | Leonardi et al. ............. 257/536 |
| 2002/0086467 A1 | * | 7/2002 | Chang et al. ............... 438/155 |
| 2002/0153564 A1 | * | 10/2002 | Shirai .......................... 257/347 |

FOREIGN PATENT DOCUMENTS

JP 7-29974 1/1995

* cited by examiner

*Primary Examiner*—Minhloan Tran
*Assistant Examiner*—Tan Tran
(74) *Attorney, Agent, or Firm*—Lisa K. Jorgenson; Robert Iannucci; Seed IP Law Group PLLC (57) ABSTRACT

A protection structure against electrostatic discharges for a semiconductor electronic device that is integrated inside a well is disclosed, wherein the well is formed on a SOI substrate and isolated dielectrically by a buried oxide layer and an isolation structure, which isolation structure includes in turn at least a dielectric trench filled with a filler material. Advantageously, the protection structure is formed at the isolation structure.

34 Claims, 3 Drawing Sheets

PROTECTION STRUCTURE AGAINST ELECTROSTATIC DISCHARGES (ESD) FOR AN ELECTRONIC DEVICE INTEGRATED ON A SOI SUBSTRATE, AND CORRESPONDING INTEGRATION PROCESS

BACKGROUND OF THE INVENTION

1. Field of the Invention

The present invention relates to a protection structure against electrostatic discharges (ESD) for an electronic device integrated on a SOI substrate.

Specifically, the invention relates to a protection structure against electrostatic discharges (ESD) for a semiconductor electronic device that is integrated inside a well, the well being formed on a SOI substrate and isolated dielectrically by a buried oxide layer and an isolation structure including at least a dielectric trench filled with a filler material.

The invention further relates to an integration process of a protection structure against electrostatic discharges (ESD) for an electronic device integrated in a SOI substrate.

The invention relates, particularly but not exclusively, to protective structures for devices that are produced with BiCMOS technologies inside wells, which wells are isolated dielectrically and formed on a SOI substrate, and the description that follows makes reference to this field of application for convenience of illustration only.

2. Description of the Related Art

It is well known that semiconductor-integrated electronic devices require to be protected against electrostatic discharge (ESD) phenomena.

An ESD protection structure for an integrated electronic device usually comprises an active protection device (a diode or a transistor), which in the event of a high charge being injected incidentally into the chip from the ambient will protect the chip against the high energy level that is created during the transient associated with the electrostatic discharge.

In particular, the integrated electronic device, also referred to as the primary device, is protected from ESD by the provision of an alternative path to ground for the flow of energy that associates with the electrostatic discharge.

From a manufacturer's standpoint, achieving electrostatic discharge protection structures is to provide low-resistivity and low-capacitance devices to be integrated, the devices occupying but a small proportion of the integration area compared to the primary device to be protected.

With standard technologies, where the integration well isolation is of the junction type, ESD protection structures are usually in the form of vertically operating components effective to afford, in particular, an electric path to ground having low resistivity and low capacitance. With such technologies, integrating electrostatic discharge protection structures is fairly simple, because a path to ground is inherently available through the substrate where the devices are integrated.

On the other hand, with SOI substrate integration technologies, no natural path to ground is available because the substrate is isolated dielectrically from the integration well by a buried oxide (BOX) layer. Accordingly, these technologies provide for no vertical diodes or transistors obvious to use as ESD protection structures.

In particular, devices realized on SOI substrates are characterized by the buried oxide layer (BOX) providing vertical isolation, and include a lateral type of isolation structure, in particular a dielectric trench structure, which can only provide lateral isolation.

Thus, the continuity from the buried oxide layer to the dielectric trench lateral isolation structure provides full dielectric isolation for the devices that are realized within suitable integration or isolation wells. The isolation wells are bordered by the buried oxide layer (BOX) and the dielectric trench lateral isolation structure.

Figure 1:
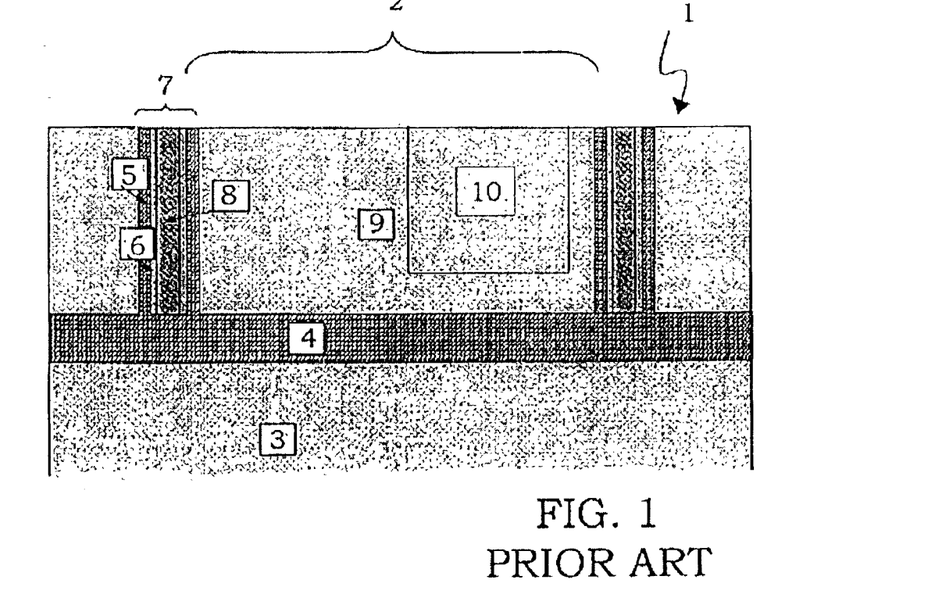
FIG. 1 shows schematically a semiconductor electronic device integrated in an SOI substrate, according to the prior art.

Shown schematically in FIG. 1 is a portion 1 of a semiconductor device, which includes essentially a dielectrically isolated well 2 formed conventionally with a technology that employs a SOI substrate.

In particular, the semiconductor device portion 1 includes a substrate or wafer handle region 3 which is customarily to provide mechanical support. When complex devices are integrated, it is sometimes utilized also as an active silicon layer.

Formed on the substrate region 3 is a buried oxide (BOX) layer 4, which is used as a vertical isolation element for the well 2, lateral isolation for the well being provided by a lateral oxidation region 5 coated with a nitride layer 6. The region 5 is formed around the edges of the well 2 in dielectric contact with the buried oxide layer 4.

In particular, the combination of two lateral oxidation regions 5 plus the respective nitride layers 6, and the underlying portion of the buried oxide layer 4, forms a so-called dielectric trench type of isolation structure 7. The dielectric trench isolation structure 7 is usually filled with filler material 8, most often polysilicon.

Thus, an integration region 9 is defined within the well 2 for various components (device wafer) that are isolated dielectrically from the remainder of the semiconductor device. For example, a primary device 10 requiring protection may be integrated in the integration region 9.

Protection structures integrated with standard technologies cannot be used with a SOI technology device 10. In particular, the absence of conductive structures of the vertical type disallows dissipation of the energy that associates with the discharge through the substrate, and enforces use of protection structures of the lateral type.

However, lateral protection structures are bound to have an extended peripheral dimension and, consequently, to occupy a large proportion of the integration area available on the chip.

This because the amount of ESD energy involved can be considerable, and powerful protection structures are needed whose size cannot be insignificant relative to the primary device to be protected.

Additionally to lacking natural structures of the vertical type directly connected to the substrate, devices integrated with SOI technologies have disadvantages due to a high thermal impedance toward the substrate and the presence of SOI layers that may be very thin.

In particular, the high thermal impedance toward the substrate interdicts prompt dissipation of the energy associated with ESD occurrences. This leads to increased surface temperature and eventual failure of the primary device to be protected, due to secondary breakdown phenomena.

Also, a very thin SOI layer results in high current densities being created in the silicon regions where the active devices are realized, and causes localized breakdowns due to the high power density that must be dissipated through small silicon volumes.

Figure 2:
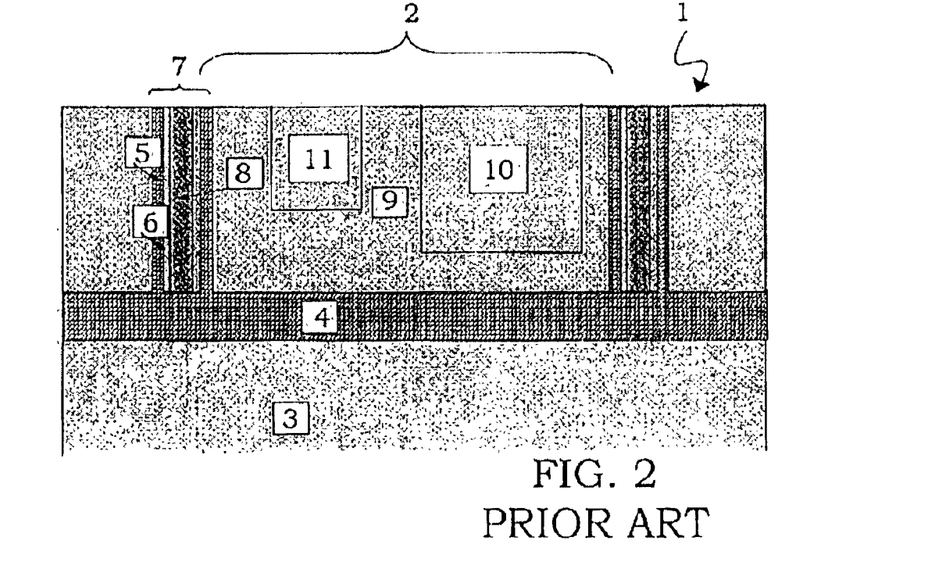
FIG. 2 shows schematically a semiconductor electronic device incorporating an ESD protection structure, according to the prior art.

Thus, it has been known to use, where SOI technologies are involved, protection structures of the lateral type or structures that, although of the vertical type locally, are in any case contacted by the surface. Such a protection structure 11 of the lateral type is integrated inside the well 2, specifically in the integration region 9, as shown schematically in FIG. 2.

A known lateral protection structure 11 is discussed, for example, in an article by K. Verhaege et al., "Analysis of Snapback in SOI NMOSFETs and its Use for an SOI ESD Protection Circuit," Proceedings of the IEEE SOI Conference, 1992, pages 140–141. According to the article, a MOS transistor realized with SOI technology is used as an ESD protection device.

A similar approach is described in U.S. Pat. No. 4,989,057 to Lu, wherein an ESD protection structure comprises essentially a MOS transistor.

Likewise, Voldman et al. in an article, "CMOS-on-SOI ESD Protection Networks," EOS/ESD Proceedings, September 1996, discuss using diode-configured MOS devices as ESD protection devices in the presence of thin SOI layers.

SOI substrate integrated devices provided with ESD protection structures are in all cases less robust than devices integrated in standard substrates by at least a factor of two, as shown by Chan et al. in an article "Comparison of ESD Protection Capability of SOI and Bulk CMOS Output Buffers," IRPS, 1994.

In the instance of SOI substrates, moreover, conventional protection structures have a lateral silicon occupation with respect to the device to be protected. Lastly, the structures proposed heretofore are all of the MOS type.

From a manufacturer's point of view, these two factors respectively bring about an unacceptable increase in the size of the chip that has to comprise the primary device with its protection structure, and significantly increased overall capacitance through the device due to the polysilicon gate structures that are inherent to unipolar components.

Also known is to use bulk transistors for ESD protection, as described in U.S. Pat. No. 4,889,829 to Kawai and U.S. Pat. No. 5,399,507 to Sun.

In particular, Kawai describes a process for producing protection bulk transistors in the substrate and SOI transistors in the isolation layer, respectively, wherein the protection bulk transistors are integrated adjacent to the active area of the device to be protected, in the same plane and using dedicated maskings.

This requires added integration area to the primary device, and brings about problems of planarity due to the complicated layout that a protection structure comprising bulk transistors involves inherently.

Sun teaches providing a thin SOI combination layer, with the ESD protection structures being integrated in the bulk layer. In particular, implanted and masked oxygen is used in making these structures. Once again, the ESD protection structures are of the MOS type and integrated adjacent to the device to be protected.

Sun's protection structure removes the critical want of planarity that affects Kawai's disclosure, but introduces dislocations within the silicon as a consequence of the oxygen implantation, so that the active device to be protected is to be integrated sufficiently far from the protection structure to prevent such dislocations from occasioning faultiness.

Again, more silicon area must be made available, which is commercially unacceptable.

Other prior solutions have been directed either to provide fully bulk-type protection structures or to use the silicon region under the isolation layer as an active area where to integrate the ESD protection structures, as disclosed in U.S. Pat. No. 6,071,803 to Rutten. The last-mentioned reference teaches a method of producing an ESD protection structure for circuitry that is integrated in substrates of the SOI type, whereby trenches filled with a conductive material place the devices integrated in the SOI layer overlying the isolation layer (device wafer) in contact with the substrate (handle wafer).

In this way, an ESD protection structure can be formed with a preferential electric path to ground because it would be integrated in the substrate, and can be a bulk structure of an adequately large size to withstand energy discharge. Also, such a protection structure occupies but a trivial amount of lateral silicon area in the SOI layer compared to the primary device, namely an area not larger than the area of the trench.

Although advantageous on several counts, this prior solution still has a number of drawbacks. In particular, the connection between the active devices integrated in the SOI layer and the protection structure in the substrate, through the conductive trench, can weaken the dielectric isolation of the well where the primary device is fabricated. Leakage toward the substrate is likely to occur, and parasitic capacitances and components to appear during dynamic operation of the primary device to be protected, such that the whole device can no longer be considered dielectrically isolated.

Furthermore, in order to avoid high current density values within the conductive trench, more trenches become necessary to improve the protection structure, making the dielectric isolation of the device even weaker.

In addition, the steps of piercing the isolating layer through the trench and filling with conductive material are additive to the manufacturing process, and are cost-intensive for the manufacturer.

To summarize, no prior art solutions provide ESD protection structures for technologies on SOI substrates, which can perform satisfactorily from all points of view and be commercially advantageous, since the lateral integration of such structures would either lead to expanded silicon occupation or incomplete dielectric isolation of the device to be protected. Thus, these prior protection structures detract from the advantages that are inherent to technologies of the SOI type.

BRIEF SUMMARY OF THE INVENTION

An embodiment of this invention provides a protection structure for electronic devices integrated in SOI substrates, which has suitable structural and functional features to ensure satisfactory protection and full isolation for the device, thereby overcoming the area occupation limitations of prior art protection structures.

The ESD protection structure is of the lateral type in a filled and/or gap region of the dielectric trench isolation structure employed to define the integration well over the SOI substrate.

Thus, the ESD protection structure is made advantageously a part of the isolation structure that defines the integration well.

The features and advantages of the protection structure and the integration process according to the invention will be apparent from the following detailed description of embodiments thereof, given by way of non-limitative examples with reference to the accompanying drawings.

DETAILED DESCRIPTION OF THE INVENTION

Figure 3:
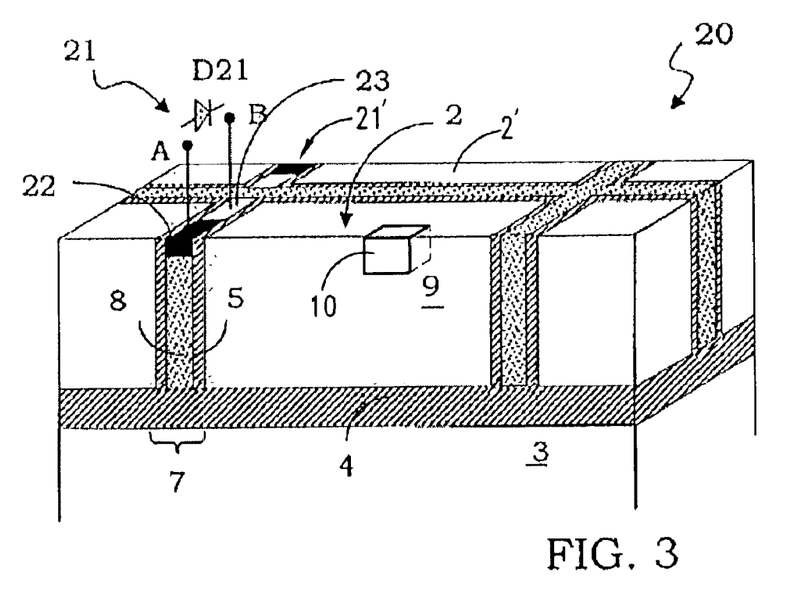
FIG. 3 shows schematically a semiconductor electronic device associated with an ESD protection structure, according to the invention.

With reference to the drawing views, in particular to FIG. 3, a semiconductor electronic device integrated in an SOI substrate is shown generally at 20 in schematic form. The same reference numerals will be used throughout this description to denote structurally and functionally identical elements with those of the device shown in FIG. 1 and previously described with reference to the prior art.

In particular, the semiconductor electronic device 20 comprises essentially a well 2, which is formed on a substrate 3 of the SOI type and isolated dielectrically by a buried oxide layer (BOX) 4 and an isolation structure 7 of the dielectric trench type, thereby to define an integration region 9 where a primary device to be protected is integrated.

As mentioned above with reference to the prior art, the substrate region 3 is also known as the handle wafer and customarily arranged to provide mechanical support.

Formed in the substrate region 3 is the buried oxide layer (BOX) 4 providing vertical isolation for the well 2. To isolate the well 2 laterally, the semiconductor electronic device 20 also comprises at least one dielectric trench 7, being in contact with the buried oxide layer 4 and filled with a filler material 8 such as polysilicon.

Advantageously, the semiconductor electronic device 20 further comprises a protection structure 21 against electrostatic discharge (ESD) phenomena.

In particular, the protection structure 21 comprises a polysilicon electronic component that is integrated in at least one trench of the isolating structure 7.

It should be noted that, with BiCMOS integration techniques in SOI substrates, it is common practice to fill the isolation trench after a step of oxidizing its sidewalls.

In particular, the photolithography trench opening and sidewall oxidizing steps are calibrated in such a way that the trench is not completely connected within itself dielectrically. This in order to prevent mechanical stresses from producing crystallization defects inside the dielectrically isolated well 2, such as would alter the electrical performance of the components integrated in the integration region 9.

Furthermore, it may be arranged for preliminarily doped portions of said polysilicon filler 8 to be biased in order to steady the potential inside the dielectrically isolated well 2 and/or prevent leakage from occurring between well and well.

In the embodiment shown in FIG. 3, the protection structure 21 comprises at least one polysilicon diode D21 formed in the filled inner region 8 of a dielectric trench 7. In particular, the diode D21 has first and second terminals A and B conventionally connected to provide ESD protection.

Advantageously, the protection diode D21 is formed by doping the filled region 8 of the trench 7. In particular, the filled region 8 comprises polysilicon, and is doped with the same (p and n) dopants that are used through the process steps for forming electronic components inside the dielectrically isolated well 2.

For example, either the enhancement dopant used for depressing the resistance of the polysilicon gate layer of MOS components, or the contact region enhancement dopant, or the same enhancement dopant as in the polysilicon filled region 8 of the trench 7, may be used as required for individual applications.

Thus, the step of doping the polysilicon filled region 8 can be carried out concurrently with a doping step already provided by the process for integrating an electronic device in an SOI substrate.

In this way, first and second regions 22 and 23 of doped polysilicon are formed in the polysilicon filled region 8 of the trench 7, and the terminals A and B are formed at the regions 22, 23.

The doped polysilicon regions 22 and 23 together form a pn junction providing for the protection diode D21.

Several protection diodes can be integrated in the polysilicon filled regions 8 and connected in parallel and/or series by suitable metal paths, so as to provide a more powerful protection structure 21.

It should be noted that the process sequence for forming a protection diode D21 in the polysilicon filled region 8 of the trench 7 substantially correspond to a sequence for integrating standard diodes that utilize the gate polysilicon layer of MOS components.

A processing sequence for integrating the protection structure 21 will now be described briefly.

It should be understood that this processing sequence for integrating the protection structure 21 is incorporated to a standard process flow for integrating semiconductor electronic devices, specifically with BiCMOS technology. Only such steps of the process corresponding to the integration of the protection structure 21 will be considered, the remaining standard steps being omitted for simplicity of description.

In particular, the process sequence for integrating the protection structure 21 comprises the following steps:

photolithographically opening the polysilicon filled region 8 of trench 7;

masking and implanting dopant in the polysilicon filled region 8 to form the first and second doped polysilicon regions 22 and 23 of the protection diode D21;

forming the first and second terminals A and B in the first and second doped polysilicon regions 22 and 23; and connecting the terminals A, B, and with them the regions 22, 23, to provide conventionally effective ESD protection through the diode D21.

Advantageously, the polysilicon filled region 8 of trench 7 can be opened during the opening step for the active area of the integrated components within the integration region 9.

In particular, the step of opening the active area can be carried out conventionally, e.g., using a so-called LOCOS technique or by etching away the field oxide layer of the semiconductor electronic device 20.

To summarize, the polysilicon region 8 inside the trench 7 is exposed and implanted simultaneously, using the same masking steps as for the enhancement and/or drain and/or source regions of the different components.

Thus, the process sequence used for integrating the components in the integration region 9 inside the dielectrically isolated well 2 need not be added steps specially to integrate the protection structure 21.

Furthermore, no added silicon area is necessary for integrating the protection structure 21 since the protection diodes D21 are integrated by utilizing a part of the dielectric trench isolating structure 7 that forms the isolation well.

In this way, no technological constraints are placed on the integration of the above protection diodes D21, either process- or device-wise.

It should be noted that the protection structure 21 allows for a sufficiently large equivalent area of the protection diodes D21 in such a way that the diodes stand up well to ESD.

The protection diodes D21 can be integrated and connected in parallel all along the polysilicon network within the dielectric trench isolation structure 7 bordering all the dielectrically isolated wells 2 that jointly form the circuitry for the whole semiconductor integrated device 20. For example, FIG. 3 shows a second dielectrically isolated well 2' that is protected from ESD discharges by a second protection device 21' form in a portion of the isolation structure 7 adjacent to the second isolated well 2'.

Series and/or parallel series connected protection diodes D21 can improve the performance of the protection structure to suit the electrical requirements of a primary device to be protected. In particular, the protection diodes D21 require to be connected in series where higher clamping voltages are demanded.

Figure 4:
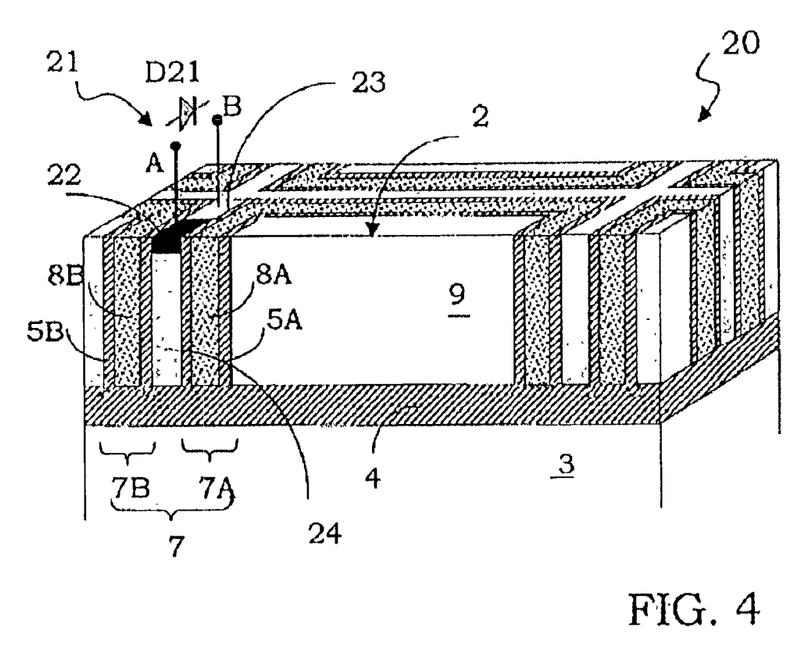
FIG. 4 shows schematically a first modified embodiment of the protection structure of FIG. 3.

FIG. 4 shows schematically a modified embodiment of the protection structure 21, wherein the protection structure 21 is again associated with the isolation well 2 of the dielectric type.

In this case, the semiconductor integrated device 20 comprises a plurality of trenches 7A; 7B integrated adjacent to one another within the dielectric trench isolation structure 7.

Employing the plurality of trenches 7A, 7B is actually a known method of attenuating mechanical stress forces that originate from the angled structure of the trenches 7 near the contact region between the oxide that forms the dielectric sidewalls 5A, 5B of the trenches 7A, 7B and the buried oxide layer 4. The method is also applied to improve the isolating performance of the dielectrically isolated well 2.

FIG. 4 shows in detail a semiconductor electronic device 20, as integrated in an SOI substrate 2, which comprises a well 2 dielectrically isolated laterally by a dielectric trench isolation structure 7 that includes at least first and second dielectric trenches 7A and 7B separated by a gap region 24.

The protection structure 21 is then integrated in the silicon gap region 24 between the first and second dielectric trenches 7A and 7B. In particular, first 22 and second 23 regions of doped polysilicon, adapted to form at least one protection diode D21 having first and second terminals A and B suitably connected to make up the ESD protection structure 21, are integrated in the silicon gap region 24.

It should be emphasized that in this case, the protection diode D21 is formed in a silicon layer, the gap region 24 indeed.

Furthermore, this gap region 24 formed from silicon enables more complex protection devices to be integrated, such as unipolar and/or bipolar components. Passive components, such as resistors, may also be integrated for a more powerful protection structure 21.

Here again, no processing steps need be added to the standard process sequence for integrating devices fabricated with BiCMOS technologies in SOI substrates to obtain the protection structure 21.

Also, no additional silicon area is required, in this modified embodiment, for integrating the protection structure 21 since its component devices are integrated using a part of the structure that forms the isolation well.

Thus, the same advantages as in the modified embodiment of FIG. 3 are obtained.

Even in the instance of a multi-trench isolating structure 7, as shown in FIG. 3, protection diodes D21 can be formed in the polysilicon filled regions 8A or 8B inside the individual trenches 7A or 7B.

Hybrid embodiments of the protection structure according to the invention are also feasible. In particular, as shown schematically in FIG. 5, diode-type protection devices can be integrated both in the polysilicon filled regions 8A, 8B (D21) of the trenches 7A, 7B and in the silicon gap region 24 (D21') having terminals (A, B and A', B') formed in respective doped polysilicon (22, 23) and silicon (22', 23') regions and suitably interconnected, e.g., by metal paths.

Figure 5:
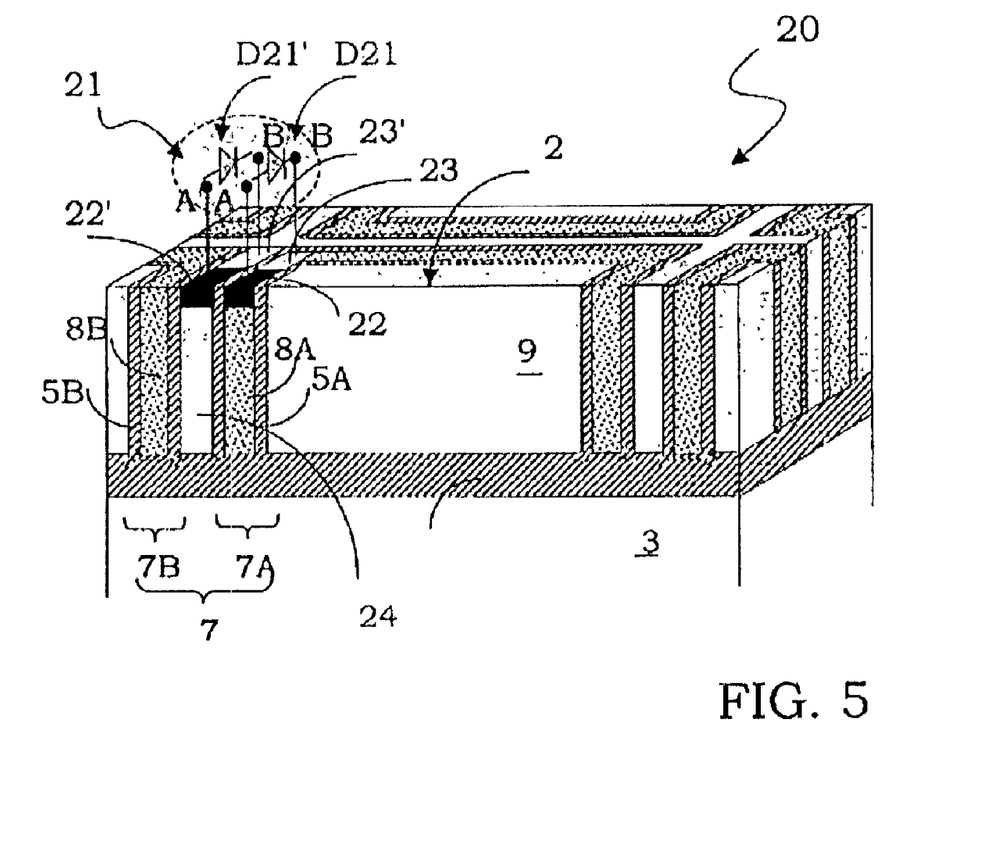
FIG. 5 shows schematically a second modified embodiment of the protection structure of FIG. 3.

In this way, the resultant protection structures 21 are made more complex and powerful, using standard integration steps and with no further area occupied.

It should be noted that the protection structure 21 is formed by a standard integration process in polysilicon 8 and/or silicon 24 regions that are customarily intended for integration of other types of devices.

Furthermore, these integration regions for the protection structure 21 are not localized because they surround the dielectrically isolated wells 2. Advantageously, no area is taken up specially for integrating the protection structure, both as regards added integration area and allocation.

The protection structure 21 can be integrated whenever required by special applications and/or device layouts, with no structural compromises.

To summarize, the protection structure 21 integrated in SOI substrates has the following advantages:

it places no penalty on the whole integrated device in terms of the required area occupation;

it does not alter the dielectric isolation properties of SOI substrates;

it provides the primary device with effective ESD protection; and it can be integrated where required at no structural compromises.

Furthermore, its integration does not involve any introduction of additional steps in the standard processing sequence used for integrating BiCMOS technology devices in SOI substrates.

All of the above U.S. patents, U.S. patent application publications, U.S. patent applications, foreign patents, foreign patent applications and non-patent publications referred to in this specification and/or listed in the Application Data Sheet are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An integrated circuit protected against electrostatic discharges, comprising:
   an SOI substrate;
   a well formed on the SOI substrate and isolated dielectrically by a buried oxide layer and an isolation structure including a dielectric trench filled with a filler material;
   a semiconductor electronic device integrated inside the well; and a protection structure formed in said isolation structure.

2. The integrated circuit according to claim 1, wherein the protection structure includes a polysilicon electronic component integrated in said isolation structure.

3. The integrated circuit according to claim 2, wherein said polysilicon electronic component is integrated in said filler material of said dielectric trench.

4. The integrated circuit according to claim 2, wherein said polysilicon electronic component is a protection diode having first and second terminals suitably connected to provide protection against electrostatic discharges.

5. The integrated circuit according to claim 4, wherein said protection diode comprises first and second doped polysilicon regions whereat said first and second terminals are formed, respectively.

6. The integrated circuit according to claim 5, wherein said first and second doped polysilicon regions are obtained by doping said filler material with the same dopants that are used in forming the semiconductor electronic device inside said dielectrically isolated well.

7. The integrated circuit according to claim 1, wherein the protection structure includes a plurality of polysilicon electronic components integrated in said isolation structure and suitably connected to form said protection structure.

8. The integrated circuit according to claim 7, wherein said polysilicon electronic components are integrated in said filler material of said dielectric trench.

9. The integrated circuit according to claim 8, wherein said polysilicon electronic components are protection diodes having respective terminals suitably connected to provide protection against electrostatic discharges.

10. The integrated circuit according to claim 7, wherein the well is a first well, the dielectric trench is a first dielectric trench, and the isolation structure further includes a second dielectric trench, the integrated circuit further comprising a second well dielectrically isolated by the second dielectric trench, wherein said polysilicon electronic components are integrated and connected in parallel all along said isolation structure.

11. The integrated circuit according to claim 1, wherein the isolation structure includes a plurality of dielectric trenches integrated adjacent to one another and separated by a silicon gap region, and the protection structure includes a polysilicon silicon electronic component integrated in said dielectric trenches.

12. The integrated circuit according to claim 11, wherein said polysilicon electronic component is a protection diode having first and second terminals suitably connected to provide protection against electrostatic discharges.

13. The integrated circuit according to claim 12, wherein said protection diode comprises first and second doped polysilicon regions whereat said first and second terminals are formed, respectively.

14. The integrated circuit according to claim 13, wherein said first and second regions are obtained by doping filler materials of said dielectric trenches with the same dopants that are used in forming further electronic components inside said dielectrically isolated well.

15. An integrated circuit protected against electrostatic discharges, comprising:
an SOI substrate;
a well formed on the SOI substrate and isolated dielectrically by a buried oxide layer and an isolation structure including a dielectric trench filled with a filler material;
a semiconductor electronic device integrated inside the well; and
a protection structure formed at said isolation structure, wherein the dielectric trench is a first dielectric trench and the isolation includes a second dielectric trench integrated adjusted to the first dielectric trench and separated from the first dielectric by a silicon gap region, and the protection structure includes a silicon electric component integrated at said gap region.

16. The integrated circuit according to claim 15, wherein said silicon electronic component is a protection diode having first and second terminals suitably connected to provide protection against electrostatic discharges.

17. The integrated circuit according to claim 16, wherein said protection diode comprises first and second doped silicon regions whereat said first and second terminals are formed, respectively.

18. The integrated circuit according to claim 17, wherein said first and second doped silicon regions are obtained by doping said gap region with the same dopants that are used in forming the semiconductor electronic device inside said dielectrically isolated well.

19. The integrated circuit according to claim 15, wherein the protection structure includes a plurality of silicon components integrated at said gap region and suitably connected to form said protection structure.

20. The integrated circuit according to claim 19, wherein said silicon components are protection diodes having respective terminals suitably connected to provide protection against electrostatic discharges.

21. The integrated circuit according to claim 15, wherein said silicon electronic component is a bipolar electronic component suitably configured to provide protection against electrostatic discharges.

22. The integrated circuit according to claim 15, wherein said silicon electronic component is a passive electronic component suitably configured to provide protection against electrostatic discharges.

23. An integrated circuit protected against electrostatic discharges, comprising;
an SOI substrate;
a well formed on the SOI substrate and isolated dielectrically by buried oxide layer and an isolation structure including a dielectric trench filled with a filler material;
a semiconductor electronic device integrated inside the well; and
a protection structure formed at said isolation structure, wherein the isolation structure includes a plurality of dielectric trenches integrated adjacent to one another and separated by a silicon gap region, and the protection structure includes a polysilicon silicon electronic component integrated at said dielectric trenches and interconnected with a silicon electronic component integrated in said gap region.

24. The integrated circuit according to claim 23, wherein said polysilicon electronic component is a protection diode having first and second terminals suitably connected to provide protection against electrostatic discharges, and said silicon electronic component is a protection diode having first and second terminals suitably connected to provide protection against electrostatic discharges.

25. The integrated circuit according to claim 24, wherein said polysilicon protection diode comprises first and second doped polysilicon regions whereat said first and second terminals are formed, respectively, and said silicon protection diode comprises first and second doped silicon regions whereat said first and second terminals are formed, respectively.

26. The integrated circuit according to claim 25, wherein said first and second regions of said polysilicon protection diode are obtained by doping filler materials of said dielectric trenches with the same dopants that are used in forming further electronic components inside said dielectrically isolated well, and that said first and second regions of said silicon protection diode are obtained by doping said gap region of said dielectric trenches with the same dopants that are used in forming the further electronic components inside said dielectrically isolated well.

27. An integrated circuit protected against electrostatic discharges, comprising:

an SOI substrate;

a semiconductor electronic device integrated inside a well formed on the SOI substrate; and isolation means for laterally, dielectrically isolating the well and for protecting the electronic device from electrostatic discharges, wherein the isolation means includes first and second dielectric walls laterally defining and isolating one side of the well and an ESD protection device positioned outside of the well and between the first and second dielectric walls.

28. An integrated circuit protected against electrostatic discharges, comprising:

an SOI substrate;

a semiconductor electronic device integrated inside a well formed on the SOI substrate; and isolation means for laterally, dielectrically isolating the well and for protecting the electronic device from electrostatic discharges, wherein the isolation means includes polysilicon filler positioned between the first and second dielectric walls and the ESD protection device is a diode that includes first and second doped regions of the polysilicon filler.

29. An integrated circuit protected against electrostatic discharges, comprising:

an SOI substrate;

a semiconductor electronic device integrated inside a well formed on the SOI substrate; and isolation means for laterally, dielectrically isolating the well and for protecting the electronic device from electrostatic discharges, wherein the isolation means includes a silicon gap positioned between the first and second dielectric walls and the ESD protection device is a diode that includes first and second doped regions of the silicon gap.

30. An integrated circuit protected against electrostatic discharges, comprising:

an SOI substrate;

a semiconductor electronic device integrated inside a well formed in the SOI substrate; and an isolation structure laterally defining and isolating one side of the well, the isolation structure including first and second dielectric walls and an ESD protection device positioned outside of the well and between the first and second dielectric walls.

31. The integrated circuit of claim 30 wherein the ESD protection device includes a plurality of diodes.

32. An integrated circuit protected against electrostatic discharges, comprising:

an SOI substrate;

a semiconductor electronic device integrated inside a well formed in the SOI substrate; and an isolation structure laterally defining and isolating one side of the well, the isolation structure including first and second dielectric walls and an ESD protection device positioned between the first and second dielectric walls, wherein the isolation structure includes polysilicon filler positioned between the first and second dielectric walls and the ESD protection device is a diode that includes first and second doped regions of the polysilicon filler.

33. An integrated circuit protected against electrostatic discharges, comprising:

an SOI substrate;

a semiconductor electronic device integrated inside a well formed in the SOI substrate; and an isolation structure laterally defining and isolating one side of the well, the isolation structure including first and second dielectric walls and an ESD protection device positioned between the first and second dielectric walls, wherein the isolation structure includes first and second isolation trenches and a silicon gap positioned between the first and second isolation trenches, the first isolation trench including the first dielectric wall, the second isolation trench including the second dielectric wall, and the ESD protection device is positioned in the silicon gap.

34. The integrated circuit of claim 33, wherein the ESD protection device is a first ESD protection device and the first isolation trench includes a third dielectric wall, a semiconductor filler positioned between the first and third dielectric walls, an a second ESD protection device formed in the semiconductor filler.

\* \* \* \* \*

UNITED STATES PATENT AND TRADEMARK OFFICE
CERTIFICATE OF CORRECTION

PATENT NO. : 6,891,208 B2
DATED : May 10, 2005
INVENTOR(S) : Salvatore Leonardi It is certified that error appears in the above-identified patent and that said Letters Patent is hereby corrected as shown below:

Column 10,
Line 3, "the isolation includes" should read as -- the isolation structure includes --.
Lines 4 and 5, "adjusted to the first dielectric trench and separated from the first dielectric" should read as -- adjacent to the first dielectric trench and separated from the first dielectric trench --.
Line 7, "electric component" should read as -- electronic component --.
Line 42, "by buried oxide layer" should read as -- by a buried oxide layer --.

Signed and Sealed this

Eleventh Day of October, 2005

JON W. DUDAS
*Director of the United States Patent and Trademark Office*